United States Patent
Lee et al.

(10) Patent No.: US 8,406,075 B2
(45) Date of Patent: Mar. 26, 2013

(54) ULTRA-LOW LEAKAGE MEMORY ARCHITECTURE

(75) Inventors: Cheng Hung Lee, Hsin-Chu (TW); Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 380 days.

(21) Appl. No.: 12/694,032

(22) Filed: Jan. 26, 2010

(65) Prior Publication Data

US 2010/0254209 A1 Oct. 7, 2010

Related U.S. Application Data

(60) Provisional application No. 61/166,556, filed on Apr. 3, 2009.

(51) Int. Cl.
*G11C 5/14* (2006.01)

(52) U.S. Cl. .......................... 365/227; 365/226; 365/229

(58) Field of Classification Search .................. 365/226, 365/227, 229
See application file for complete search history.

(56) References Cited

U.S. PATENT DOCUMENTS

| | | | | |
|---|---|---|---|---|
| 5,909,141 A * | 6/1999 | Tomishima | ..................... | 327/536 |
| 6,049,245 A * | 4/2000 | Son et al. | ...................... | 327/544 |
| 6,208,170 B1 * | 3/2001 | Iwaki et al. | ..................... | 326/121 |
| 6,343,044 B1 * | 1/2002 | Hsu et al. | ...................... | 365/227 |
| 6,426,908 B1 * | 7/2002 | Hidaka | .......................... | 365/222 |
| 6,434,076 B1 * | 8/2002 | Andersen et al. | ............. | 365/222 |
| 6,556,071 B2 * | 4/2003 | Notani et al. | .................. | 327/544 |
| 6,570,439 B2 * | 5/2003 | Berthold | ........................ | 327/544 |
| 6,836,175 B2 * | 12/2004 | Morikawa | ..................... | 327/534 |
| 6,836,179 B2 * | 12/2004 | Mizuno et al. | ................. | 327/544 |
| 6,997,519 B2 * | 2/2006 | Fischbacher et al. | ..... | 301/35.621 |
| 7,170,327 B2 * | 1/2007 | Aksamit | ........................ | 327/202 |
| 7,227,804 B1 * | 6/2007 | Kothandaraman et al. | ... | 365/229 |
| 7,274,217 B2 * | 9/2007 | Chuang et al. | .................. | 326/83 |
| 7,327,630 B2 * | 2/2008 | Park | ............................... | 365/226 |
| 7,362,646 B2 * | 4/2008 | Otsuka et al. | .................. | 365/226 |
| 7,372,764 B2 * | 5/2008 | Nautiyal et al. | ............... | 365/229 |
| 7,394,687 B2 * | 7/2008 | Bertin et al. | ............. | 365/185.08 |
| 7,411,423 B2 * | 8/2008 | Berthold et al. | ................. | 326/98 |
| 7,436,205 B2 * | 10/2008 | Tada | ............................... | 326/33 |
| 7,436,206 B2 * | 10/2008 | Kurotsu | .......................... | 326/34 |
| 7,447,101 B2 * | 11/2008 | Fallah et al. | ................... | 365/227 |
| 7,521,762 B2 * | 4/2009 | Hidaka | .......................... | 257/369 |
| 7,532,036 B2 * | 5/2009 | Fujikawa et al. | ............... | 326/98 |
| 7,554,871 B2 * | 6/2009 | Park et al. | ...................... | 365/226 |
| 7,557,508 B2 * | 7/2009 | Kim et al. | ...................... | 313/585 |
| 7,570,537 B2 * | 8/2009 | Bhatia | .......................... | 365/226 |
| 7,623,405 B2 * | 11/2009 | Lysinger et al. | .............. | 365/229 |
| 7,626,883 B2 * | 12/2009 | Shimano et al. | .............. | 365/226 |
| 7,692,992 B2 * | 4/2010 | Matsubara | ..................... | 365/222 |
| 7,760,011 B2 * | 7/2010 | Wang et al. | ..................... | 327/544 |
| 7,835,214 B2 * | 11/2010 | Kim et al. | ...................... | 365/226 |
| 7,848,172 B2 * | 12/2010 | Dudeck et al. | ................. | 365/227 |

(Continued)

FOREIGN PATENT DOCUMENTS

| | | |
|---|---|---|
| JP | 2000-021169 | 1/2000 |
| JP | 2008-159145 | 7/2008 |

*Primary Examiner* — Viet Q Nguyen
(74) *Attorney, Agent, or Firm* — Slater & Matsil, L.L.P.

(57) ABSTRACT

An integrated circuit structure includes an active power supply line and a data-retention power supply line. A memory macro is connected to the active power supply line and the data-retention power supply line. The memory macro includes a memory cell array and a switch. The switch is configured to switch a connection between connecting the memory cell array to the active power supply line and connecting the memory cell array to the data-retention power supply line. The data-retention power supply line is outside of the memory macro.

20 Claims, 4 Drawing Sheets

U.S. PATENT DOCUMENTS

| | | | |
|---|---|---|---|
| 7,852,113 B2 * | 12/2010 | Terzioglu et al. | 326/33 |
| 7,863,971 B1 * | 1/2011 | Nayak et al. | 327/546 |
| 7,894,291 B2 * | 2/2011 | Braceras et al. | 365/229 |
| 7,948,263 B2 * | 5/2011 | Kim et al. | 326/33 |
| 8,022,753 B2 * | 9/2011 | Ikeda | 327/544 |

* cited by examiner

ULTRA-LOW LEAKAGE MEMORY ARCHITECTURE

This application claims the benefit of U.S. Provisional Application No. 61/166,556 filed on Apr. 3, 2009, entitled "Ultra-Low Leakage Memory Architecture," which application is hereby incorporated herein by reference.

TECHNICAL FIELD

This invention relates generally to integrated circuits, and more particularly to power-providing architectures of memories, and even more particularly to reduction in the variation of data-retention power supply voltages.

BACKGROUND

In many electronic applications, particularly portable electronic devices such as mobile communication devices, reducing power consumption is one of the key requirements in the respective integrated circuit design. One of the methods for reducing power consumption is using dual operation mode, in which the normal operation of the integrated circuit may use normal operation voltage VDD, which is high enough to drive the integrated circuit to achieve required high performance. In operations not demanding in the area of performance, a reduced operation voltage (data-retention voltage, also sometimes known as gated-VDD) may be used to provide power to the integrated circuits. Under the data-retention voltage that is lower than operation voltage VDD, less power is consumed. The data-retention voltage, although causing degradation in the performance of the integrated circuit, is not an issue in certain operations, such as in the power down mode or standby mode.

Conventionally, the data-retention voltage is provided by embedded voltage regulators, which are embedded in memory macros. FIG. 1 illustrates a conventional circuit capable of providing operation voltage VDD and a data-retention voltage. Power supply line 100 carries operation voltage VDD. PMOS transistors P1 and P2 are used to control whether operation voltage VDD or the data-retention voltage is supplied to memory macro 102. By supplying a low voltage to the gate of PMOS transistor P1 and a high voltage to the gate of PMOS transistor P2, operation voltage VDD is provided to the SRAM periphery logic and cell array in memory macro 102. Conversely, by supplying a high voltage to the gate of PMOS transistor P1 and a low voltage to the gate of PMOS transistor P2, the data-retention voltage, which equals voltage VDD minus the voltage drop on diode D1, is provided to the SRAM periphery logic and cell array in memory macro 102. In FIG. 1, diode D1 acts as an embedded voltage regulator.

The conventional circuit, however, suffers from drawbacks. The voltage-drop Vdiode and the data-retention voltage are affected by process variations and temperature variations. For example, the data-retention voltage gated-VDD of one circuit working at a slow-slow (SS) process corner (meaning both PMOS and NMOS transistors have low performance and low power consumption) may have its data-retention voltage equal to a first value. Another circuit having the same circuit design but working at a fast-fast (FF) process corner (meaning NMOS transistors and PMOS transistors are fast) however, will have a data-retention voltage having a second value different from the first value. The variation in the data-retention voltage may incur one of two consequences. If the data-retention voltage is too high, the leakage current of memory macro 102 will be high, and hence the purpose of having the data-retention voltage is defeated. If the data-retention voltage is too low, the data stored in memory macro 102 may be lost.

In addition, the voltage drop Vdiode on diode D1 is also related to the current Idiode flowing through diode D1, and a fluctuation in current Idiode causes a fluctuation in voltage drop Vdiode, and vice versa. Therefore, the data-retention voltage varies when the current Idiode flowing through diode D1 fluctuates. Further, current Idiode is determined by the leakage current of memory macro 102. Accordingly, different memory macros having different designs, for example, different sizes may have different leakage currents, which in turn affects current Idiode and voltage drop Vdiode. This means that to reduce the effect of current Idiode on voltage drop Vdiode, voltage regulators that are more complicated than simple diodes may be needed. What is needed, therefore, is a method and structure for overcoming the above-described shortcomings in the prior art.

SUMMARY OF THE INVENTION

In accordance with one aspect of the present invention, an integrated circuit structure includes an active power supply line and a data-retention power supply line. A memory macro is connected to the active power supply line and the data-retention power supply line. The memory macro includes a memory cell array and a switch. The switch is configured to switch a connection between connecting the memory cell array to the active power supply line and connecting the memory cell array to the data-retention power supply line. The data-retention power supply line is outside of the memory macro.

In accordance with another aspect of the present invention, an integrated circuit structure includes an active power supply line; a data-retention power supply line; and a first and a second memory macro connected to the active power supply line and the data-retention power supply line. Each of the first memory macro and the second memory macro includes a memory cell array; a switch configured to switch a connection between connecting the memory cell array to the active power supply line and connecting the memory cell array to the data-retention power supply line; and a low-leakage mode control pin coupled to the switch. The switch is configured to connect one of the active power supply line and the data-retention power supply line to the memory cell array based on a signal on the low-leakage mode control pin.

In accordance with yet another aspect of the present invention, an integrated circuit structure includes a first active power supply line; a second active power supply line disconnected from the first active power supply line; a first data-retention power supply line; and a second data-retention power supply line disconnected from the first data-retention power supply line. A first memory macro is connected to the first active power supply line and the first data-retention power supply line. The first memory macro includes a first memory cell array and a first switch connecting the first memory cell array to the first active power supply line and the first data-retention power supply line. The first data-retention power supply line is outside of the first memory macro. A second memory macro is connected to the second active power supply line and the second data-retention power supply line. The second memory macro includes a second memory cell array and a second switch connecting the second memory cell array to the second active power supply line and the second data-retention power supply line. The second data-retention power supply line is outside of the second memory macro.

The advantageous features of the present invention include reduced variation in data-retention power supply voltages, and hence improved data retention ability without increasing leakage currents. Further, the design of power supply architecture is simplified.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel memory supply architecture for providing power to a memory macro is provided. The variations and the operation of the embodiment are then discussed. Throughout the various views and illustrative embodiments of the present invention, like reference numbers are used to designate like elements.

Figure 1:
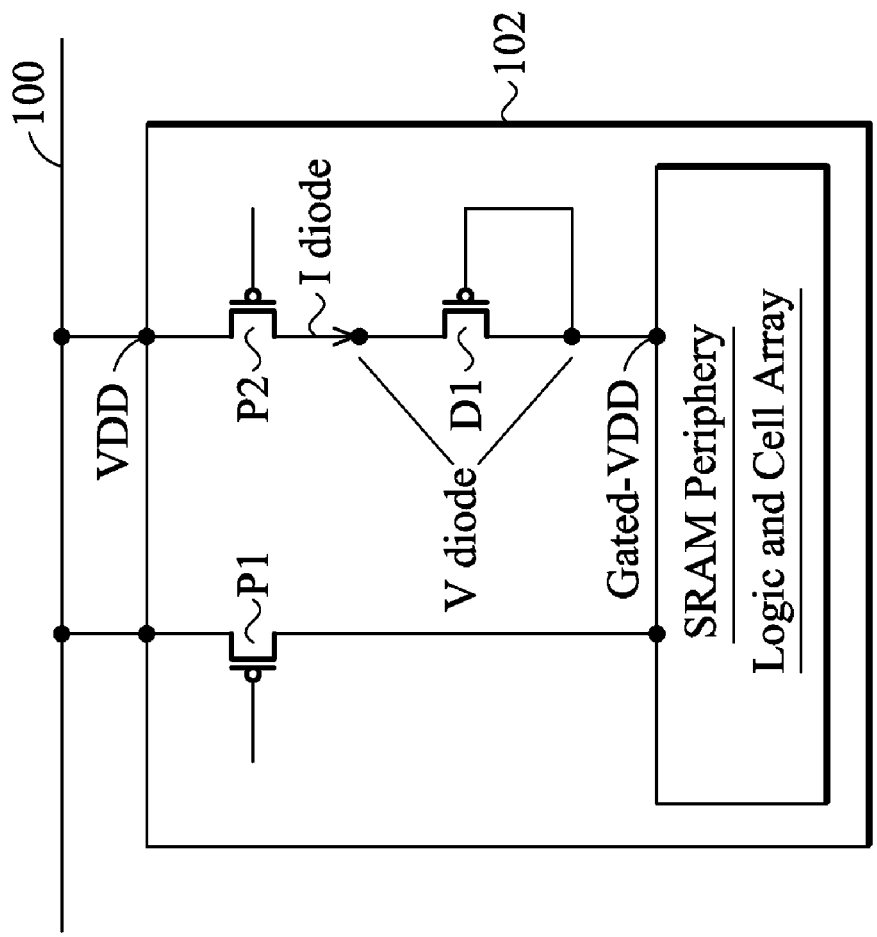
FIG. 1 illustrates a conventional memory architecture including an embedded voltage regulator for locally generating a data-retention power supply voltage.
Figure 2:
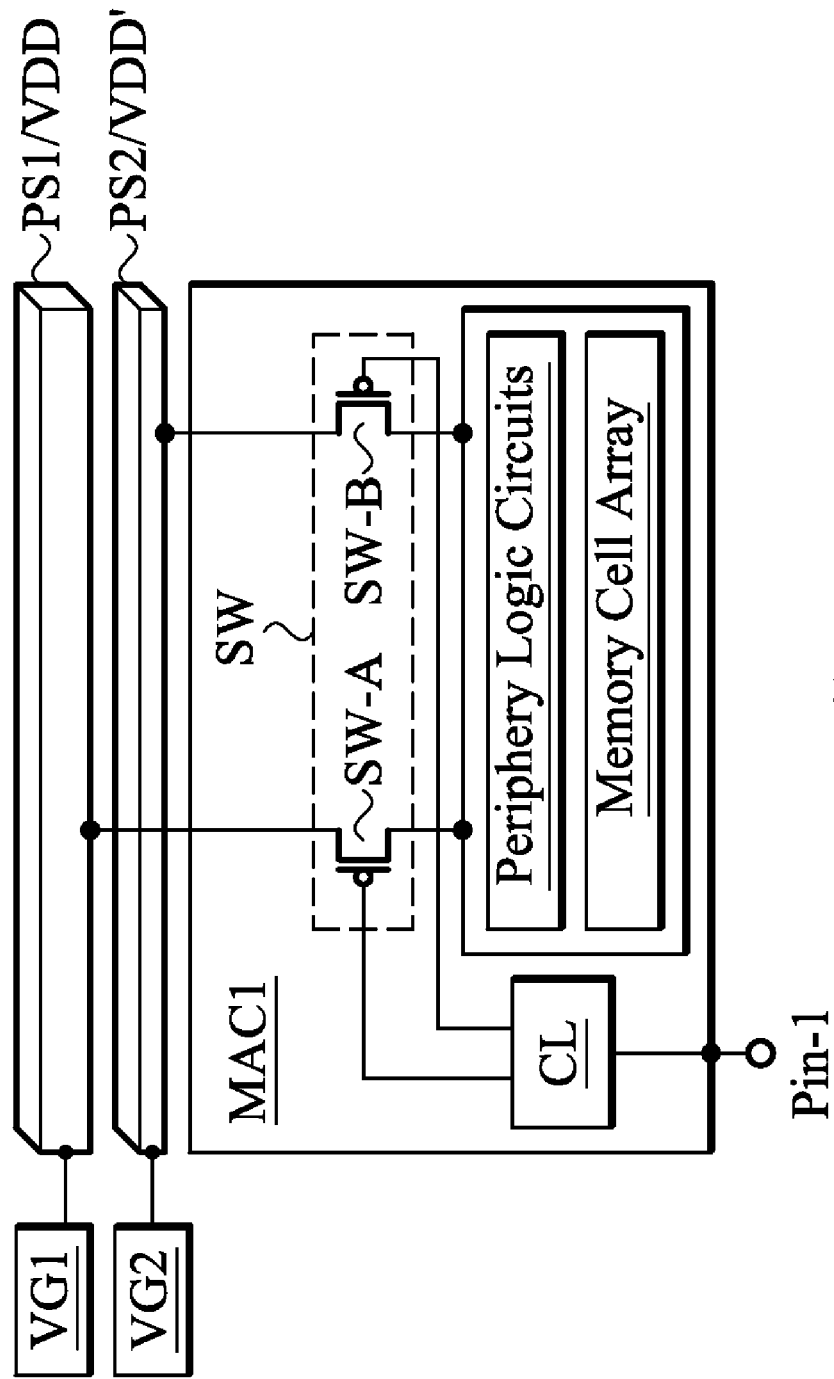
FIG. 2 illustrates a memory macro receiving an external active power supply voltage and an external data-retention power supply voltage.

FIG. 2 illustrates an embodiment, which includes memory macro MAC1. In an embodiment, memory macro MAC1 includes one or more memory cell array(s), and periphery logic circuits for accessing the memory cell array(s). Periphery logic circuits may include control circuits such as decoders, drivers, input/output circuits, and the like. In an embodiment, the memory cell array is a static random access memory (SRAM) array including SRAM cells. In other embodiments, the memory cell array may be other types of memory cell arrays such as embedded dynamic random access memory (eDRAM) arrays.

Memory macro MAC1 is connected to power supply lines PS1 and PS2. Power supply line PS1 carries power supply voltage VDD, which is high enough to support memory macro MAC1 for active operations, such as read and write operations. Accordingly, power supply voltage VDD is also referred to as an active power supply voltage. Power supply line PS2 carries power supply voltage VDD', which is lower than power supply voltage VDD, and is used to support memory macro MAC1 for inactive operations, such as data retention. Accordingly, power supply voltage VDD' is also referred to as a data-retention power supply voltage. In an exemplary embodiment, data-retention power supply voltage VDD' is lower than active power supply voltage VDD by a voltage difference between Vth and 70%*VDD, wherein Vth is the threshold voltage of an NMOS transistor although greater or smaller voltage differences may be applied.

In an embodiment, a plurality of memory macros, or even all memory macros (not shown, please refer to FIG. 3), in a same chip share a same power supply line PS1 and a same data-retention power supply line PS2. In other embodiments, all memory macros in a same chip share a same power supply line PS1, and a plurality of data-retention power supply lines PS2, wherein one of the data-retention power supply lines PS2 may be shared by more than one memory macro. In this embodiment, different data-retention power supply lines PS2 may have a same voltage or different voltages. Active power supply voltage VDD may be generated by voltage generator VG1 and data-retention power supply voltage VDD' may be generated by voltage generator VG2, both outside of memory macro MAC1. Data-retention power supply voltage VDD' may be, or may not be, generated by regulating active power supply voltage VDD. Voltage generator VG2 may be designed as a complicated circuit that is substantially free from process, voltage, and/or temperature (PVT) variations. However, since voltage generator VG2 provides power to multiple memory macros, the chip area penalty is low even if voltage generator VG2 may occupy a relatively large chip area.

Referring again to FIG. 2, switch SW is embedded inside memory macro MAC1, and has the function of connecting either active power supply voltage VDD or data-retention power supply voltage VDD' to the memory cell array and possibly to the periphery logic circuits in memory macro MAC1. In an embodiment, switch SW includes a first switch SW-A connected between active power supply line PS1 and the memory cell array, and a second switch SW-B connected between data-retention power supply line PS2 and the memory cell array. Switches SW-A and SW-B are operated in reverse logic, that is, when switch SW-A is turned on (to connect active power supply line PS1 to the memory cell array), switch SW-B is turned off, and vice versa. Accordingly, control logic circuit CL that controls the operation of switches SW-A and SW-B may include an inverter (not shown). In an exemplary embodiment, switches SW-A and SW-B are PMOS transistors, although other types of switches may be used.

Control logic circuit CL may be connected to low-leakage mode control pin Pin-1 (referred to as control pin Pin-1 hereinafter), which is connected outside of memory macro MAC1. Control pin Pin-1 may be provided with a logic low or a logic high signal to control whether memory macro MAC1 should be operated under an active mode, in which read and write operations may be performed, or a data-retention mode. When control pin Pin-1 indicates the active mode, logic control circuit CL and switch SW are operated to connect active power supply voltage VDD to the memory cell array. Conversely, if control pin Pin-1 indicates the data-retention mode, logic control circuit CL and switch SW are operated to connect data-retention power supply voltage VDD' to the memory cell array. During the data-retention mode, due to the reduced data-retention power supply voltage VDD', leakage currents consumed by memory macro MAC1 are reduced.

Data-retention power supply voltage VDD' is for the purpose of data retention, during which time memory cells in memory macro MAC1 only require very little current for maintaining data, which current is mainly comprised of leakage currents. On the other hand, to support read and write operations, active power supply line PS1 needs to provide relatively high currents. To reduce the undesirable voltage drop on active power supply line PS1 in order to provide a substantially constant voltage VDD to all macros connected to active power supply line PS1, active power supply line PS1 may be much wider than data-retention power supply line PS2. In an exemplary embodiment, the power provided by power supply line PS1 is 10 times, and may even be 100 times, greater than the power provided by data-retention power supply line PS2. Accordingly, the cross-sectional area S1 of active power supply line PS1 may be greater than about 10 times, or even greater than about 100 times, the cross-sectional area S2 of data-retention power supply line PS2, wherein areas S1 and S2 are measured in planes perpendicular to the lengthwise directions of active power supply line PS1 and data-retention power supply line PS2, respectively.

Figure 3:
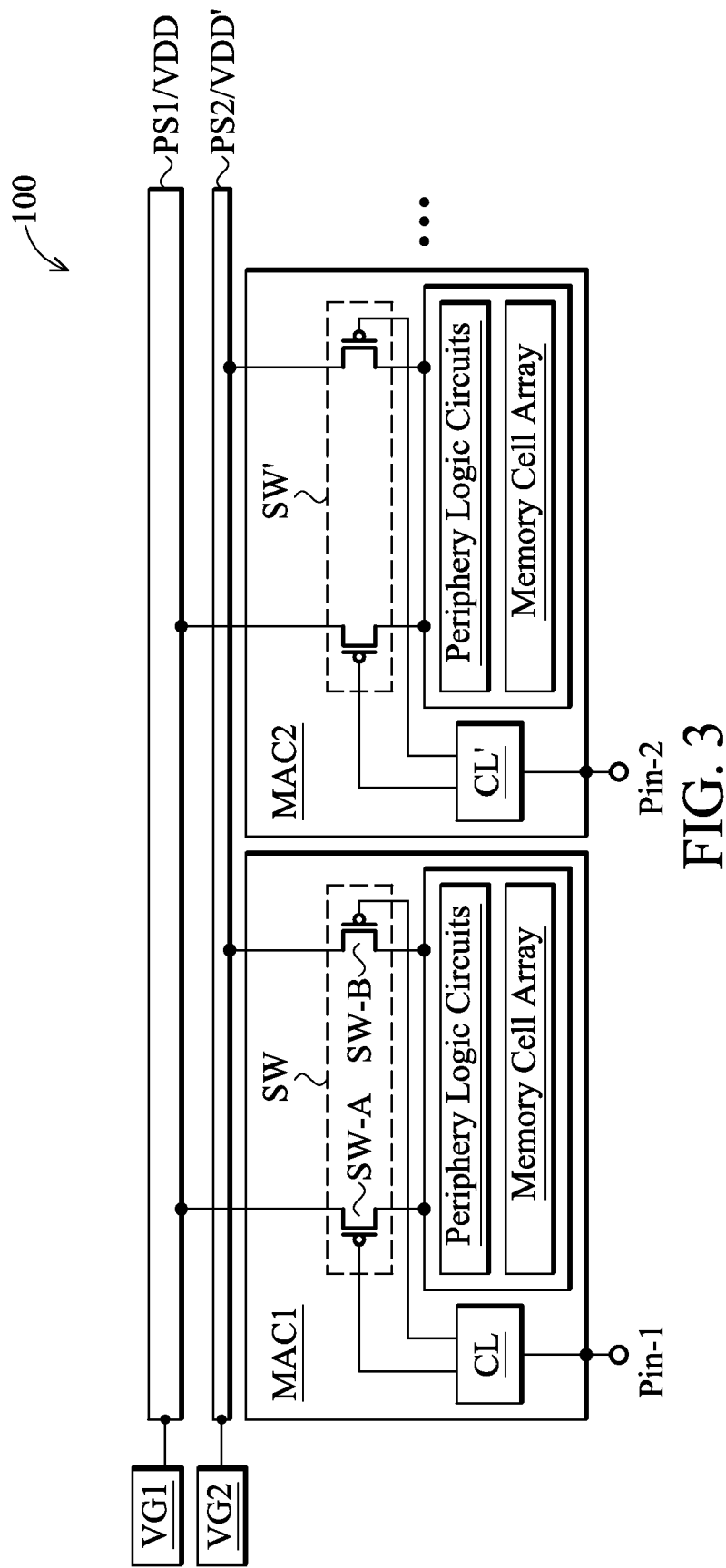
FIG. 3 illustrates a plurality of memory macros connected to a same active power supply line and a same data-retention power supply line.

FIG. 3 illustrates memory circuit 100, which includes a plurality of memory macros. The embodiment may be a memory compiler, which may be a portion of a memory compiler chip. Active power supply line PS1 and data-retention power supply line PS2 are connected to the plurality of memory macros. For simplicity, only memory macro MAC1 and memory macro MAC2 are illustrated. Memory macro MAC1 and memory macro MAC2 may be identical to each other, or may be different from each other. For example, memory macros MAC1 and MAC2 may be different in the size of the memory array(s), different in the number of memory arrays, different in the design of peripheral logic circuits, and/or the like. Similar to memory macro MAC1, memory macro MAC2 also includes switch SW', control logic circuit CL', and low-leakage mode control pin Pin-2. The operation of memory macro MAC2 is essentially the same as memory macro MAC1, and hence is not repeated herein.

It is noted that by embedding switches SW and SW' in memory macros MAC1 and MAC2, respectively, the sizes of switches SW and SW' can be customized based on the leakage currents of memory macros MAC1 and MAC2, respectively, which leakage currents are also related to the design and the sizes of memory macros MAC1 and MAC2. Therefore, switches SW and SW' may occupy as small of a chip area as possible while at the same time can still conduct enough current for retaining the data in memory macros MAC1 and MAC2, respectively.

Figure 4:
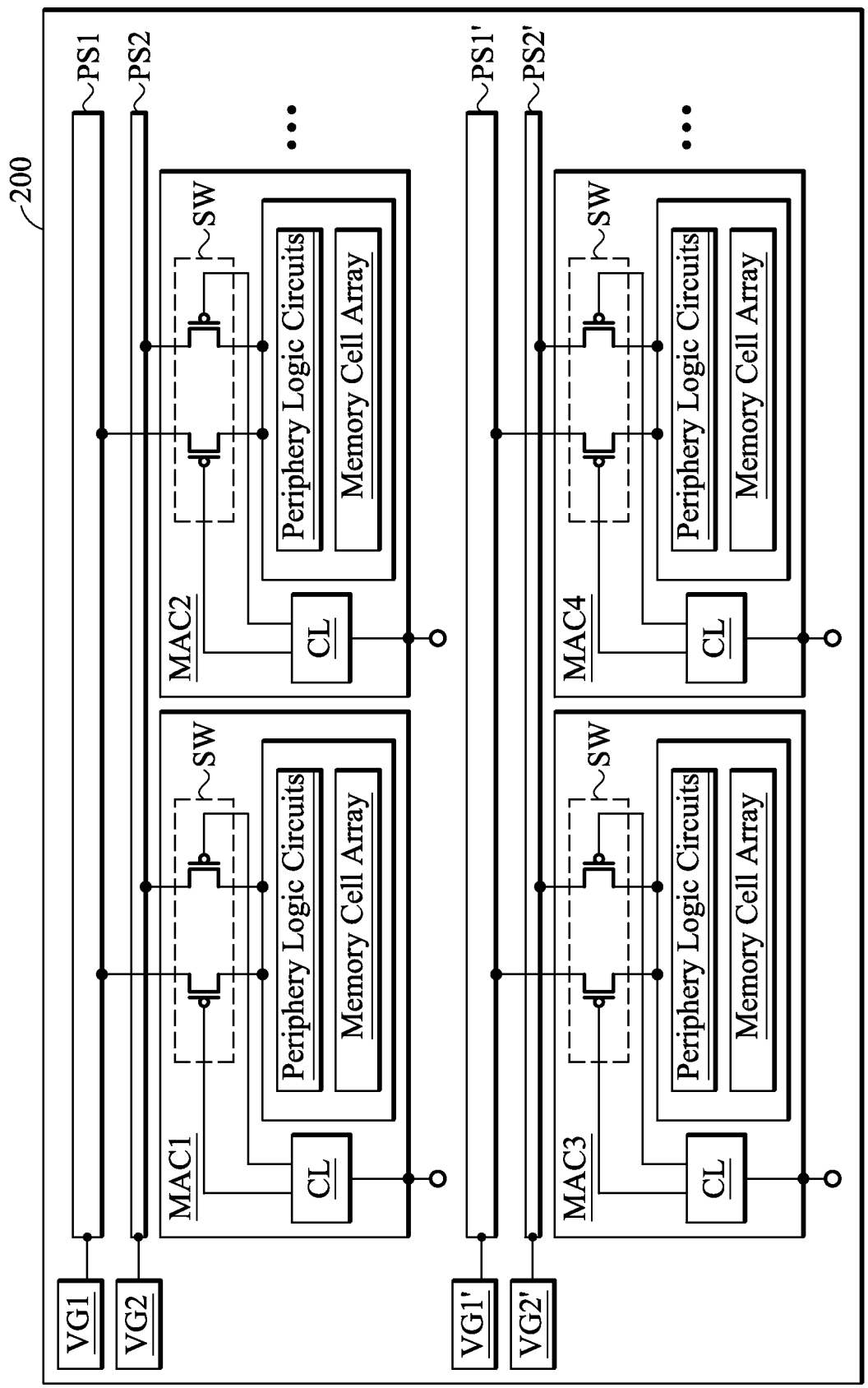
FIG. 4 illustrates a semiconductor chip including two groups of memory macros, wherein each group of memory macros shares an active power supply line and a data-retention power supply line.

FIG. 4 illustrates yet another embodiment, which may also be a memory compiler application inside memory chip 200. In this embodiment, there are two or more groups of memory macros. The first group of memory macros includes memory macros MAC1 and MAC2, and is connected to power supply lines PS1 and PS2. Voltage generators VG1 and VG2 generate the active power supply voltage and the data-retention power supply voltage for power supply lines PS1 and PS2, respectively. The second group of macros includes memory macros MAC3 and MAC4, and is connected to power supply lines PS1' and PS2'. Voltage generators VG1' and VG2' generate the active power supply voltage and the data-retention power supply voltage for power supply lines PS1' and PS2', respectively. Active power supply lines PS1 and PS1' may be connected to each other or disconnected from each other. Data-retention power supply lines PS2 and PS2' may be connected to each other or disconnected from each other. In an embodiment, active power supply lines PS1 and PS1' carry different active power supply voltages, while data-retention power supply lines PS2 and PS2' may carry the same or different data-retention power supply voltages. In alternative embodiments, data-retention power supply lines PS2 and PS2' carry different data-retention power supply voltages, while active power supply lines PS1 and PS1' may carry the same or different active power supply voltages. By grouping memory macros into different groups, different memories requiring different active power supply voltages and/or different data-retention power supply voltages may be built in a same memory compiler application, while still maintaining optimum operation voltages.

The embodiments of the present invention have several advantageous features. By providing external data-retention power supply voltages that are less prone to PVT variations, leakage currents of memories may be reduced without sacrificing the data retention ability of the memories. Further, substantially no chip area penalty is incurred due to the sharing of the data-retention power supply voltages among multiple memory macros.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
    an active power supply line;
    a data-retention power supply line, wherein the data-retention power supply line has a first cross-sectional area smaller than a second cross-sectional area of the active power supply line; and
    a memory macro connected to the active power supply line and the data-retention power supply line, the memory macro comprising:
        a memory cell array; and
        a switch configured to switch a connection between connecting the memory cell array to the active power supply line and connecting the memory cell array to the data-retention power supply line, wherein the data-retention power supply line is outside of the memory macro.

2. The integrated circuit structure of claim 1 further comprising:
    a low-leakage mode control pin connecting from inside the memory macro to outside the memory macro; and
    a control logic circuit connected between the low-leakage mode control pin and the switch, wherein the control logic circuit is configured to operate the switch based on a signal on the low-leakage mode control pin.

3. The integrated circuit structure of claim 1, wherein the data-retention power supply line and the active power supply line are connected to a plurality of memory macros.

4. The integrated circuit structure of claim 3, wherein all memory macros in a semiconductor chip are connected to the data-retention power supply line and the active power supply line.

5. The integrated circuit structure of claim 3, wherein the plurality of memory macros is in a memory compiler chip.

6. The integrated circuit structure of claim 1, wherein the second cross-sectional area is greater than the first cross-sectional area by greater than about 10 times.

7. The integrated circuit structure of claim 1, wherein the data-retention power supply line carries a first positive voltage lower than a second positive voltage carried by the active power supply line.

8. The integrated circuit structure of claim 1, wherein the switch comprises:
- a first switch connecting the active power supply line to the memory array; and
- a second switch connecting the data-retention power supply line to the memory array.

9. An integrated circuit structure comprising:
- an active power supply line;
- a data-retention power supply line, wherein the data-retention power supply line has a first cross-sectional area smaller than a second cross-sectional area of the active power supply line; and
- a first and a second memory macro connected to the active power supply line and the data-retention power supply line, wherein each of the first memory macro and the second memory macro comprises:
  - a memory cell array;
  - a switch configured to switch a connection between connecting the memory cell array to the active power supply line and connecting the memory cell array to the data-retention power supply line; and
  - a low-leakage mode control pin coupled to the switch, wherein the switch is configured to connect one of the active power supply line and the data-retention power supply line to the memory cell array based on a signal on the low-leakage mode control pin.

10. The integrated circuit structure of claim 9, wherein the first memory macro is identical to the second memory macro.

11. The integrated circuit structure of claim 9, wherein the first memory macro is different from the second memory macro.

12. The integrated circuit structure of claim 9, wherein the second cross-sectional area is greater than the first cross-sectional area by greater than about 100 times.

13. The integrated circuit structure of claim 9, wherein the data-retention power supply line carries a lower voltage than the active power supply line.

14. The integrated circuit structure of claim 9, wherein the first memory macro and the second memory macro are portions of a memory compiler.

15. An integrated circuit structure comprising:
- a first active power supply line;
- a second active power supply line disconnected from the first active power supply line;
- a first data-retention power supply line;
- a second data-retention power supply line disconnected from the first data-retention power supply line;
- a first memory macro connected to the first active power supply line and the first data-retention power supply line, wherein the first memory macro comprises:
  - a first memory cell array; and
  - a first switch connecting the first memory cell array to the first active power supply line and the first data-retention power supply line, wherein the first data-retention power supply line is outside of the first memory macro; and
- a second memory macro connected to the second active power supply line and the second data-retention power supply line, wherein the second memory macro comprises:
  - a second memory cell array; and
  - a second switch connecting the second memory cell array to the second active power supply line and the second data-retention power supply line, wherein the second data-retention power supply line is outside of the second memory macro.

16. The integrated circuit structure of claim 15, wherein the first active power supply line and the first data-retention power supply line are connected to a first plurality of memory macros, and wherein the second active power supply line and the second data-retention power supply line are connected to a second plurality of memory macros.

17. The integrated circuit structure of claim 15, wherein the first active power supply line has a cross-sectional area greater than a cross-sectional area of the first data-retention power supply line.

18. The integrated circuit structure of claim 15, wherein the first data-retention power supply line carries a different voltage than the second data-retention power supply line.

19. The integrated circuit structure of claim 1, wherein the switch is configured to disconnect the memory cell array from the data-retention power supply line upon connecting the memory cell array to the active power line, and disconnect the memory cell array from the active power line upon connecting the memory cell array to the data-retention power supply line.

20. The integrated circuit structure of claim 9, wherein the switch is configured to disconnect the memory cell array of the respective one of the first memory macro and the second memory macro from the data-retention power supply line upon connecting the memory cell array to the active power line, and disconnect the memory cell array of the respective one of the first memory macro and the second memory macro from the active power line upon connecting the memory cell array to the data-retention power supply line.

* * * * *